April 11, 1961 B. H. PINCKAERS 2,979,626

PULSE GENERATOR HAVING CONDITION-RESPONSIVE TIMING MEANS

Filed June 9, 1958 2 Sheets-Sheet 1

INVENTOR.
BALTHASAR H. PINCKAERS
BY Omund R. Dahle
ATTORNEY

April 11, 1961 B. H. PINCKAERS 2,979,626

PULSE GENERATOR HAVING CONDITION-RESPONSIVE TIMING MEANS

Filed June 9, 1958 2 Sheets-Sheet 2

INVENTOR.
BALTHASAR H. PINCKAERS
BY Omund R. Dahle
ATTORNEY

United States Patent Office 2,979,626

Patented Apr. 11, 1961

2,979,626

PULSE GENERATOR HAVING CONDITION-RESPONSIVE TIMING MEANS

Balthasar H. Pinckaers, Edina, Minn., assignor to Minneapolis-Honeywell Regulator Company, Minneapolis, Minn., a corporation of Delaware Filed June 9, 1958, Ser. No. 740,840

10 Claims. (Cl. 307—88.5)

This invention relates to a new and improved semiconductor pulse generator apparatus to provide the square wave pulse output which has an "On" time which is variable in accordance with a condition.

An object of the invention is to provide a transistor pulse generator circuit which has a variable duration "On" time and which has a relatively constant "Off" time.

Figure 1:
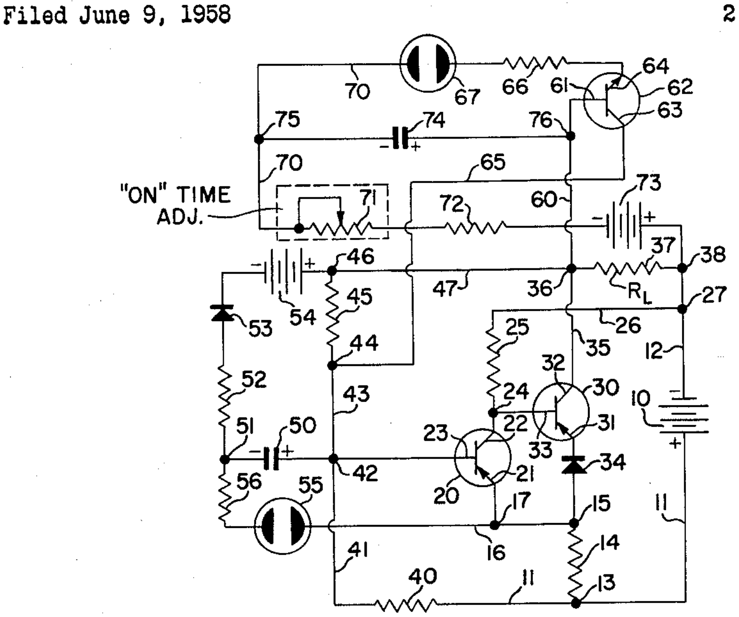
Figure 2:
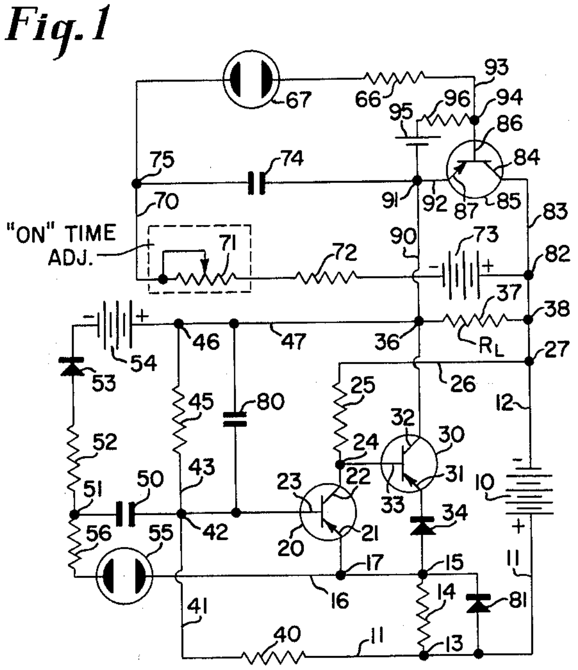
Figure 3:
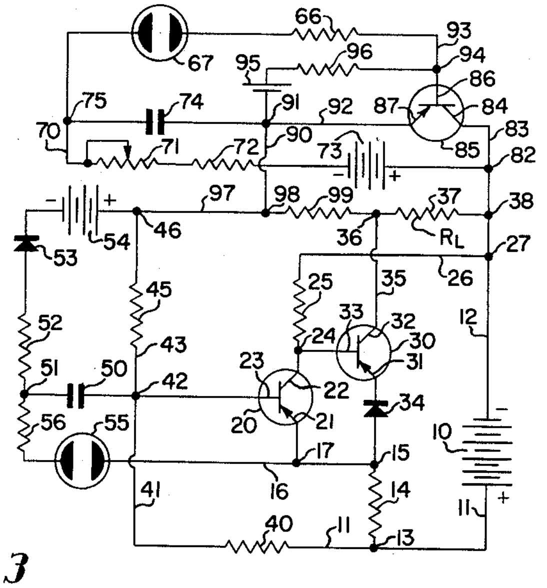
Figure 4:
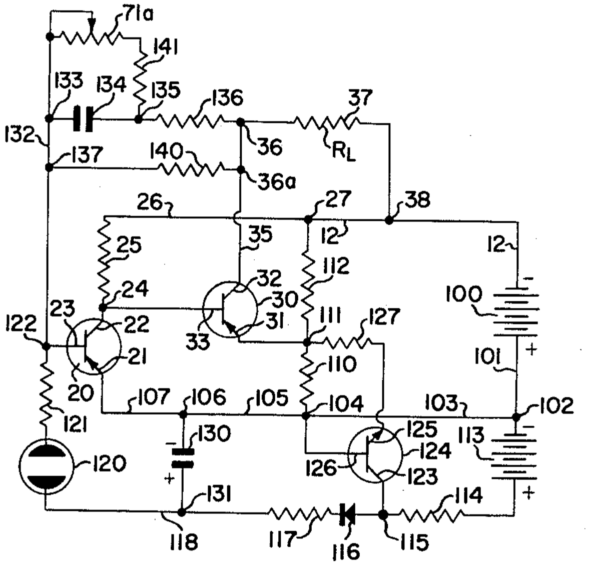

This and other objects of the invention will become more apparent upon consideration of the accompanying claims, specification and drawings of which:

Figure 1 is a schematic representation of the circuit of an embodiment of the invention; and Figures 2, 3 and 4 are schematic representations of other modifications of the invention.

Referring now to Figure 1 there is disclosed a source of electrical energy 10, shown here as a battery, which has its positive terminal connected to a conductor 11 and its negative terminal connected to a conductor 12. A junction 13 on the conductor 11 is connected by a resistor 14 to a junction 15. The circuit includes a semiconductor amplifying device 20, here shown as a p-n-p junction transistor, which has an emitter electrode 21, a collector electrode 22 and a base electrode 23. The emitter electrode 21 is connected to a junction 17 on a conductor 16 which terminates at the junction 15. The collector electrode 22 is connected to the negative terminal of the source 10 by a circuit which includes the junction 24, a resistor 25, and a conductor 26 which terminates at a junction on the conductor 12.

A second semiconductor amplifier device 30, here shown as a p-n-p junction transistor, has an emitter electrode 31, a collector electrode 32 and a base electrode 33. The base electrode 33 is directly connected to the junction 24. A voltage pedestal, here shown as a semiconductor diode, interconnects the junction 15 with the emitter electrode 31. The collector electrode 32 of transistor 30 is connected through a conductor 35, a junction 36, the load device 37, here shown as a resistive element, to a junction 38 on the negative conductor 12. The voltage divider network is connected from the positive conductor 11 to the junction 36 which includes a resistor 40, a conductor 41, a junction 42, a conductor 43, a junction 44, a resistor 45, a junction 46 and a conductor 47 to the junction 36. The base electrode 23 of transistor 20 is directly connected to the junction 42.

Another electrical path may be traced from the junction 42 to the junction 46, which path includes in series a capacitor 50, a junction 51, a current limiting resistor 52, a rectifying diode 53 and a direct current potential source 54 which has its positive terminal connected to the junction 46. A circuit may also be traced from the junction 15 through the conductor 16 to a glow lamp 55, such as a General Electric type NE–76, and through a current limiting resistor 56 to the junction 51.

The junction 36 is connected by a conductor 60 to the base electrode 61 of a semiconductor amplifying device 62, here shown as a junction type n-p-n transistor. The transistor 62 also has a collector electrode 63 and an emitter electrode 64. The collector electrode 63 is connected by a conductor 65 to the junction 44. The emitter electrode 64 is connected through a current limiting resistor 66, a glow lamp 67, a conductor 70, a variable impedance 71, here shown as a potentiometer, a resistor 72, and a source of potential 73 which has its positive terminal connected to the junction 38. A capacitor 74 is connected between a junction 75 on the conductor 70 and a junction 76 on the conductor 60.

*Operation of Figure 1*

The circuit of Figure 1 is a pulse generator type circuit which provides a square wave excitation to the load device 37. As will be explained in detail hereafter, when the transistor 30 is rendered conductive the load device 37 is energized from the main source of power 10. The circuit is designed so that transistor 30 is alternately rendered conductive and non-conductive with the "On" time duration being adjustable and the "Off" time being fixed.

Let us assume initial operating conditions such that transistor 30 is not conductive. Under these conditions, a current path may be traced from the positive terminal of battery 10 through a voltage divider network which comprises in series the resistors 40, 45 and the impedance of the load device 37. The resistor 45 is preferably a relatively large value compared to the resistance of either resistor 40 or the load device 37 so that nearly all of the voltage applied from battery 10 appears across the resistor 45. The resistor 14 and the emitter to base junction of transistor 20 are in circuit parallel to the resistor 40 and therefore a current is also flowing in the emitter-base circuit of transistor 20 rendering this transistor conductive. Another current path may be traced from the positive terminal of the battery 10 through the resistor 14, from emitter 21 to collector 22 of the transistor 20 and through the resistor 25 and the conductor 26 to the negative terminal of the battery 10. Since the transistor 20 is biased into the conductive state, the output impedance is low and the voltage drop between the emitter 21 and the collector 22 is a very small value. This low voltage also appears between the base electrode 33 of transistor 30 and the junction 15. The effect of the rectifying diode 34 in series with the emitter-base junction of transistor 30 is effective to maintain the emitter current of the transistor 30 at a substantially zero value so that the transistor 30 is maintained cut off. During this period the load device 37 is unenergized.

Considering now the potential drop existing across the resistor 45, previously explained, together with the potential of the battery source 54, it will be noted that the two potentials are connected in series and are additive with respect to the series circuit comprising the capacitor 50, the resistor 52 and the rectifier 53, and a current flows through these elements to charge the capacitor 50. It will be noted that a current path can be traced from the left hand terminal of capacitor 50 through the resistor 56 to the left hand electrode of the glow tube 55. A current path may also be traced from the right terminal of the capacitor 50 through the base to emitter of the transistor 20 and through conductor 16 to the right hand electrode of glow tube 55. The glow tube 55 is therefore connected in a shunt relationship to the capacitor 50. The glow tube utilized in one successful embodiment of the invention is a General Electric type NE–76 which has a firing voltage of approximately 72 volts and an extinction voltage of approximately 55 volts. In the preferred mode of operation the magnitude of the voltage of battery 54 is chosen to be somewhat less than the extinction voltage of the glow tube, for example 45 volts. The sum of the potentials of battery 54 and the potential drop across resistor 45 is sufficient to charge the capacitor 50 to a voltage exceeding the firing voltage of the glow tube.

Up until this time the transistor 20 has been maintained conductive and the transistor 30 is cut off. Upon the potential charge on capacitor 50 reaching the firing point of glow tube 55, the glow tube fires through a path which may be traced from the right hand terminal of capacitor 50 through the low impedance of conducting transistor 20 from base electrode 23 to emitter electrode 21, through conductor 16, through the glow tube 55, and through current limiting resistor 56 and junction 51 to the left hand electrode of capacitor 50. This initial current path is only momentary, since as the current builds up, the reverse current flowing through the base to emitter of transistor 20 becomes equal to the normal bias current flowing from the emitter to base of the transistor 20, and therefore the transistor 20 is rendered non-conductive and the input impedance from base 23 to emitter 21 becomes very high.

As a consequence of transistor 20 being driven to cutoff, the collector current of transistor 20 is reduced to a very low value. Therefore the potential at junction 24 tends to move in a negative going direction and as a result the transistor 30 is rendered conductive. A bias current path for the transistor 30 can be traced from the positive terminal of battery 10 through the conductor 11, the junction 13, the resistor 14, the rectifier 34, from emitter 31 to base 33 of transistor 30 and through the resistor 25 and the conductor 26 to the negative terminal of the battery 10. An output current path may also be traced through the transistor 30 from emitter 31 to collector 32 and through the conductor 35, the junction 36, the load device 37 and through conductor 12 to the negative terminal of the battery 10, thereby energizing the load device.

The circuit is designed so that with output transistor 30 conductive, the series resistance of the resistor 14, the rectifier 34 and the output impedance of the transistor is relatively low compared to the impedance of the load device 37, so that substantially all of the voltage of battery 10 appears across the load resistor. Under these conditions the potential at junction 36 approaches the positive potential of the battery 10 so that now the potential across the resistor 45 is reduced nearly to zero. The potential charge on the capacitor 50 may now be larger than the voltage of source 54, however, the rectifier 53 prevents the discharge of the capacitor through the battery 54 and the resistor 52. The capacitor may continue to discharge, however, through the resistor 40, the resistor 14, the glow tube 55 and the resistor 56 until the extinction point of the glow tube is reached.

The circuit comprising transistors 20 and 30 and associated resistors 14, 40, 45, 25, and 17 ($R_T$) is designed so that it is a bistable switching circuit. The discharge current of capacitor 50 is designed to be in the form of a rapidly decaying pulse of sufficient magnitude to trigger transistor 20 "off" and thus transistor 30 "on." When the pulse due to the discharge of capacitor 50 vanishes, the circuit will remain in this condition (transistor 30 "on"). Since, as will be shown later, the time during which transistor 30 is "on" is variable, it follows that, if rectifier 53 were not present to prevent discharge of capacitor 50 after glow tube 55 has been fired, the voltage of capacitor 50 at the time the bistable circuit is reset (transistor 30 "off") would be to some degree dependent on the "on" time of transistor 30. This then also would mean that the "off" time (transistor 30 non-conductive) would be somewhat dependent on the "on" time (transistor 30 conductive). Since it is one of the objects of the invention to provide a fixed "off" time regardless of the length of "on" time the rectifier 53, which may be of the low reverse leakage type such as silicon, is included.

Referring now to the circuit associated with capacitor 74, a capacitor charging circuit can be traced from the positive right hand terminal of battery 73 to junction 38, through the load device 37 to junction 36, through conductor 60 to junction 76, through the capacitor 74 to junction 75, through conductor 70, "on" time adjustment potentiometer 71, and through resistor 72 to the negative left hand terminal of battery 73. The magnitude of the voltage of battery 73 is chosen to be somewhat less than the extinction voltage of the glow tube 67, which may be of the same type as glow tube 55 if desired. It will be noted that the period during which the transistor 30 is conductive and the load device 37 is energized, the potential drop across the load device 37 is additive to the potential of battery 73, and the sum of these two potentials exceeds the voltage required to fire glow tube 67. During this time when the load 37 is energized, the capacitor 74 continues to charge toward the firing potential of the glow tube 67 at a rate determined by the setting of on-time potentiometer 71.

When the voltage on capacitor 74 reaches the firing point of glow tube 67, the glow tube fires and the capacitor 74 begins to discharge from the positive right hand terminal of the capacitor through the junction 76, the base to emitter of transistor 62, through the current limiting resistor 66, the glow tube 67 and junction 75 to the negative left hand terminal of capacitor 74.

The discharge from capacitor 74 is in the form of a rapidly decaying current pulse through base to emitter of transistor 62 and glow tube 67. When this pulse occurs a further current path can be traced from the junction 44, which is always positive with respect to junction 36, through the conductor 65 to the collector 63 of transistor 62, through the transistor 62 from collector 63 to the base 61 to junction 36. The current flowing in this path has the same effect that lowering of resistance 45 would have. The current through resistor 40 is increased correspondingly and as the voltage drop across resistor 40 exceeds the voltage drop across resistor 14, which is a function of the load current, it can be seen that junction 15 becomes again positive with respect to junction 42 and hence transistor 20 is biased in the "forward" direction so that it becomes conductive again. With transistor 20 again becoming conductive its output impedance drops and the voltage between the emitter 21 and the collector electrode 22 again drops to a very low value so that the transistor 30 is rendered non-conductive. With transistor 30 now non-conductive the current through the load device 37 is reduced nearly to zero, the potential drop across the load device becomes very low and the initial bias conditions for the transistor 20 again prevail. Under these conditions the substantially large potential again appears across resistor 45 with the junction 44 positive with respect to junction 46, and the capacitor 50 again begins to charge towards the firing potential of glow tube 55 to repeat the cycle.

It will be noted that the potentiometer 71 may be adjusted to control the charging rate of capacitor 74 and thus to vary the on-time of the circuit. In one successful embodiment of the invention the on-time was variable from fifteen milliseconds to 1.25 seconds by proper adjustment of the potentiometer 71. It will be recognized that although the on-time adjustment potentiometer 71 has been shown in the form of a potentiometer, this element could be a condition responsive resistance element whose resistance varied as a function of a condition being sensed so that the on-time of the system is controlled as a function of the condition being sensed. An example of a condition responsive impedance element might be a temperature responsive resistor or a humidity responsive resistor or the like.

*Figure 2*

The embodiment of the invention disclosed in Figure 2 is in part similar to the disclosure of Figure 1, and the corresponding elements have been given the same identifying numerals in Figure 2 as has been disclosed and described for Figure 1. In the following discussion concerned with the components and construction of the circuit of Figure 2, the discussion will be limited primarily to the portions of Figure 2 not previously disclosed. The components of Figure 2 carrying the same identifying numerals as in Figure 1 perform substantially the same function as has been previously described.

A coupling capacitor 80 is connected in parallel with the resistor 45 to couple the collector electrode 32 of transistor 30 to the base electrode 23 of the transistor 20. A junction diode 81 is connected in parallel with the resistor 14. A junction 82 on the negative conductor 12 is connected by means of a conductor 83 to the collector electrode 84 of a semiconductor amplifying device 85, here shown as a p-n-p junction transistor. The semiconductor device 85 also includes a base electrode 86 and an emitter electrode 87. The junction 36 is connected through a conductor 90, a junction 91 and a conductor 92 to the emitter electrode 87 of transistor 85. The emitter electrode 87 and the collector electrode 84 are the output electrodes of the transistor 85, and as connected are in shunt with the load device 37. The right hand electrode of the glow tube 67 is connected through the resistor 66, a conductor 93 and a junction 94 to the base electrode 86 of the transistor 85. The junction 91 is connected through a potential source 95 and a resistor 96 to the junction 94.

In considering the operation of the circuit of Figure 2, the initial period during which transistor 30 is nonconductive and the load device 37 is unenergized, will not again be discussed since the operation is substantially the same as discussed for Figure 1. As has been described for the operation of the circuit of Figure 1, in the circuit of Figure 2 the off-time of the circuit is substantially constant, and the on-time of the circuit can be widely varied depending upon the impedance of the device 71. Let us now consider the circuit operation of Figure 2 commencing with the instant when transistor 30 becomes conductive thus permitting energization of the load device 37. With transistor 30 conductive a current path can be traced from the positive terminal of battery 10 through the conductor 11, through the resistor 14 and through the diode 81 which is in parallel with the resistor 14 and which shunts the resistor when the transistor 30 is conductive, through the rectifying diode 34 and the transistor 30, to junction 36, through the load device 37, and back to the negative terminal of the battery 10.

As previously mentioned, the circuit is designed so that with output transistor 30 conductive, the series resistance of the resistor 14 and parallel diode 81, the rectifier 34, and the output impedance of transistor 30 is relatively low compared to the impedance of the load device 37 so that nearly all of the voltage of battery 10 appears across the load device. It will be noted that the potential of the battery 73 and the voltage drop across the load device 37 are additive to produce a double potential source when transistor 30 is conductive. A capacitor charging circuit can be traced from the junction 36 through the conductor 90 to junction 91, through capacitor 74 to the junction 75, through conductor 70, potentiometer 71, and through current limiting resistor 72 to the negative terminal of battery 73 which forms the negative terminal of the double voltage supply. During the time when the load 37 is energized, the capacitor 74 continues to be charged toward the firing potential of the glow tube 67 at a rate determined by the setting of the on-time potentiometer 71. The battery 95 in the input circuit of transistor 85 provides a reverse bias to maintain the transistor sharply cutoff until the charge time on the capacitor 74 reaches the firing potential of the glow tube 67. As the firing point of glow tube 67 is reached, a current path may be traced from the positive right hand terminal of capacitor 74 to junction 91 through the battery 95 and resistor 96 to the junction 94, through conductor 93, the resistor 66, the glow tube 67, junction 75 and then to the negative left hand terminal of the capacitor 74. As the current through the resistor 96 increases to the point at which the IR drop across the resistor exceeds the voltage of biasing battery 95, the transistor 85 is rendered conductive and current also flows through a path which may be traced from junction 91 through the transistor from emitter 87 to base 86 and thus to junction 94. When transistor 85 is rendered conductive the output impedance of the transistor between emitter 87 and collector 84 becomes very low and shunts the load device 37. Since the output impedance of the transistor 85 is low compared to the impedance of the load device 37, this low impedance shunting path results in a potential change at junction 36 in a negative going direction. This potential variation is coupled through the capacitor 80 to the base electrode 23 of transistor 20 and is of a polarity to initiate conduction in the transistor 20. With transistor 20 again becoming conductive, the transistor 30 is rendered non-conductive and the load device is deenergized.

For proper operation of this circuit it is required that the product of the base current of transistor 85 times the D.C. gain of that transistor is equal to or larger than the product of the voltage of battery 10 times the D.C. gain of transistor 30 divided by the resistance of resistor 25. If this condition is not met, the bistable circuit comprising transistors 20 and 30 may not switch when transistor 85 becomes conductive.

*Figure 3*

Figure 3 is in most respects similar to the circuit of Figure 2 and like components carry the same identifying numerals as have been disclosed for the circuit of Figure 2. The conductor 47 of Figures 1 and 2 has been replaced in Figure 3 by a series circuit commencing at junction 46 and comprising a conductor 97, a junction 98 and a resistor 99 which terminates at the junction 36. In Figure 3 the junction 91 is connected by means of the conductor 90 to the junction 98 rather than to the junction 36 as has been shown for Figure 2. In addition the capacitor 80 has been omitted in Figure 3. In other respects the circuit of Figures 2 and 3 are alike.

In considering the operation of the circuit of Figure 3, the operation during the off-time when transistor 30 is not conductive is the same as has been discussed for the operation of the circuit of Figure 1 and will not be again discussed here. The operation of the circuit during the on-time when transistor 30 is conductive and the load is energized, is somewhat different from what has been described for Figure 2 and will be discussed in detail below. Considering now the condition of operation during which transistor 30 is conductive and the load device 37 is energized, it will be noted that the voltage appearing across the load device 37 is additive to the voltage of battery 73 in the same manner as has previously been described for the circuits of Figures 1 and 2. A capacitor charging path may be traced from the positive terminal of the double power supply comprising the voltage across the load device 37 and battery 73, from the junction 36 to the resistor 99, the junction 98, the conductor 90, the junction 91, through the capacitor 74 to junction 75, through the potentiometer 71 and the resistor 72 to the negative terminal of battery 73. The charging current flowing in the capacitor 74 is limited by the impedance of resistor 72 and potentiometer 71 which are very large with respect to the resistor 99. The potential across resistor 99, therefore, due to the capacitor charging current is insignificant. When the capacitor potential reaches the firing point of the glow tube so that the glow tube fires and renders the transistor 85 conductive, it can be seen that the resistor 99 and the output electrodes of transistor 85 form a shunt path around the load device 37. Since the output impedance of the transistor 85 is low with respect to the resistor 99, substantially all the voltage drop across the load device also appears across resistor 99 so that the potential at junction 98 approaches that of the negative terminal of battery 10. This potential suddenly appearing in the base bias circuit of transistor 20 causes the transistor 20 to commence conducting and the bistable circuit reverts to the initial condition in which transistor 20 is conducting and transistor 30 is maintained cutoff. It will be noted that in this modification of the invention the quality and current carrying capacity of the transistor 85 is not critical.

*Figure 4*

In Figure 4 there is disclosed the circuit having a source of potential 100, here shown as a battery. The positive terminal of the battery is connected by means of a conductor 101, a junction 102, a conductor 103, a junction 104, a conductor 105, a junction 106, and a conductor 107, to the emitter electrode 21 of a semiconductor amplifying device 20, which may be of the same type disclosed in Figure 1. The negative terminal of battery 100 is connected by means of a conductor 12, a junction 27, a conductor 26, a resistor 25 and a junction 24 to the collector electrode 22 of the semiconductor device 20. The junction 104 is connected by the resistor 110, a junction 111, and a resistor 112 to the junction 27. The junction 111 is directly connected to the emitter electrode 31 of a semiconductor device 30, which may be of the same type as described in Figure 1. The junction 24 is directly connected to the base electrode 33 of the semiconductor device 30. The collector electrode 32 is connected by a conductor 35, a junction 36, and the load device 37, to the junction 38 on the negative conductor 12.

The negative terminal of a second source 113 is connected to the junction 102. The positive terminal of the source 113 is connected through a resistor 114, a junction 115, a unidirectional current conducting device 116, here shown as a junction diode, a resistor 117, a conductor 118, a glow tube 120, a resistor 121 and a junction 122 to the base electrode 23 of the transistor 20. The junction 115 is directly connected to the collector electrode of a semiconductor device 124, here shown as an n-p-n junction transistor. The transistor 124 also has an emitter electrode 125 and a base electrode 126. The base electrode 126 is directly connected to the junction 104, and the emitter electrode 125 is connected by means of a resistor 127 to the junction 111. A capacitor 130 is connected between the junction 106 and a junction 131 on the conductor 118. The base electrode 23 is also connected by the junction 122, a conductor 132, from a junction 133 on the conductor 132 through a capacitor 134, a junction 135, and a resistor 136, to the junction 36. A resistor 140 is connected between a junction 137 on the conductor 132 and the junction 36*a* on the conductor 35. The conductor 132 terminates at one terminal of the on-time adjust potentiometer 71*a* and a current path may be traced through the potentiometer and through a resistor 141 to the junction 135.

In considering the operation of the embodiment of the invention of Figure 4, let us first consider the off period the pulse generator when transistor 30 is non-conductive and the load device 37 is unenergized. A current path may be traced from the positive terminal of the battery 113 through the current limiting resistor 114, the rectifying diode 116, the resistor 117, and through the capacitor 130 and back to the negative terminal of the battery 113 thereby causing the capacitor 130 to charge. At the same time a current path may be traced from the positive terminal of battery 100 to the conductors 101, 103, 105, and 107, to the emitter electrode 21 of transistor 20, from base electrode 23 through conductor 132, potentiometer 71*a*, resistors 141 and 136 to junction 36, and through the load device 37 and conductor 12 to the negative terminal of battery 100. A portion of the base current from transistor 20 also flows through the resistor 140 which parallels the resistors 71*a*, 141, and 136. The impedance of the resistors 140, 136, 141 and potentiometer 71*a* is large compared to the impedance of the load device 37 so that a very large portion of the voltage supply from battery 100 is dropped across these resistors between the base electrode 23 and the junction 36. The timing capacitor 134 which is in parallel with the potentiometer 71*a* and the resistor 141 becomes charged during this period of operation of the circuit. The voltage to which the capacitor is charged being somewhat dependent upon the adjustment of the potentiometer wiper of potentiometer 71*a*.

As the capacitor 130 becomes charged to the firing potential of the glow tube 120, the glow tube fires and a current path may be traced from the lower positively charged terminal of the capacitor 130 through the glow tube 120, resistor 121, from base electrode 23 to emitter electrode 21 of the conductive transistor 20 and back through to the upper terminal of the capacitor 130. This discharge current path is sufficient in magnitude to exceed the forward bias current of the transistor 20 and the transistor 20 is rendered non-conductive. With the transistor 20 non-conductive the voltage drop across resistor 25 due to the collector current is reduced and transistor 30 is biased to a conductive condition. A load current path may be traced from the positive terminal of battery 100 through the conductors 101 and 103 to junction 104, through resistor 110 to junction 111, through the transistor 30 from emitter 31 to collector 32, and through the load device 37 back to the negative terminal of battery 100. The impedance of the load device 37 is relatively large with respect to the remaining impedances in the load circuit so that a large portion of the potential of battery 100 is now dropped across the load device. A relatively small potential, for example, in the order of several volts is dropped across the resistor 110. This potential is sufficient to render the n-p-n transistor 124 conductive, and a current path may be traced from the junction 104 through the transistor from base 126 to emitter 125 and through the resistor 127 to the junction 111. This transistor is connected in the common base configuration and the output impedance of the transistor between collector 123 and base electrode 126 becomes relatively low. The current from battery 113 now flows through current limiting resistor 114, through the transistor to junction 104, and back through conductor 103 to the negative terminal of the battery 113, so that during the period transistor 124 is conductive the capacitor 130 is not being charged because nearly all of the voltage of battery 113 appears across resistor 114. The rectifying diode 116 prevents the capacitor from discharging through resistor 117 and the transistor during this period of operation.

As has previously been stated, during the off period of the circuit the capacitor 134 has been charged. Now during the on period, the capacitor 134 discharges through the potentiometer 71*a* and the resistor 141 and also through the resistors 140 and 136. The setting of potentiometer 71 which controls the potential to which the capacitor charged also controls the discharge rate of the capacitor 134. The charge on the capacitor 134 is effective to maintain the transistor 20 cutoff until the capacitor is substantially discharged. A sufficient potential then appears between the base electrode 23 and the junction 36 to cause the transistor 20 to again commence conducting and the bistable circuit reverts to the initial condition with transistor 20 conducting and transistor 30 cutoff so that the load device is now unenergized. With transistor 30 non-conducting the potential drop across resistor 110 is insufficient to maintain the conduction of transistor 124 and the capacitor 130 is again charged toward the firing point of the glow tube to repeat the cycle. As in the other embodiments of the invention, the circuit of Figure 4 has a substantially fixed off-time and an on-time which is variable by adjusting the potentiometer 71*a*. It is to be understood that while the on-time controlling device has been disclosed as a potentiometer it may be a condition responsive impedance device.

Many changes and modifications of this invention will undoubtedly occur to those who are skilled in the art and I therefore wish it to be understood that I intend to be limited by the scope of the appended claims and not by the specific embodiments of my invention which are disclosed herein for the purpose of illustration only.

I claim:

1. Pulse width modulation semiconductor control apparatus for providing controllable pulse energization to a load in response to a condition, comprising: electric current valve means including a semiconductor amplifying device, said means having a first non-conductive condition of operation and a second current conductive condition of operation, said current valve means comprising output terminals and a control circuit, said current valve means being operable from one to the other of said conditions upon a signal being applied to said control circuit; a source of power; load means; circuit means connecting said current valve means and said load means in a series circuit to said source such that said current valve means controls the current flow to said load means; and double timing means having a first portion responsive to said electric current valve means switching to said second conductive operating condition, and second timing portion being thereupon activated to provide a timing function thereafter for controlling the power on time to said load means, said first portion including a condition responsive impedance element for adjusting said timing means, said timing means also including means connected to said current valve means for producing a signal upon a predetermined time having elapsed to cause said current valve means to switch to said first non-conductive condition, said timing means having a further signal producing timing portion connected to said valve means control circuit for rendering said valve means conductive upon said switching means having operated for a predetermined time in said first condition.

2. Pulse width modulation semiconductor control apparatus for providing controllable pulse energization to a load in response to a condition, comprising: bistable current switching means including semiconductor amplifying means, said switching means having a first non-conductive condition of operation and a second current conductive condition, said switching means comprising switching terminals and a control circuit, said switchng means being operable from one to the other of said conditions upon a signal being applied to said control circuit; a source of power; load means; circuit means connecting said switching terminals of said switching means and said load means in a series circuit to said source such that said current switching means controls the current flow to said load means; first timing means connected to and energized substantially simultaneously with said load means to thereupon initiate a timing function for controlling the power on time to said load means, said first timing means including a condition responsive impedance element for adjusting said timing means, said timing means also including means connected to said control circuit for producing a signal upon said timing function having occurred to cause said switching means to switch to said first non-conductive condition; and further signal producing timing means connected to be activated upon said switching means returning to said first condition to thereafter provide a second timing function culminating in a signal for rendering said switching means again conductive.

3. Pulse width modulation semiconductor control apparatus for providing a variable width pulse output to a load in response to a condition, comprising; bistable electronic switching means including a semiconductor amplifying device, said electronic switching means having a first non-conductive condition of operation and a second current conductive condition of operation, said means comprising a switching circuit and a control circuit, said electronic switching means being operable from one to the other of said conditions upon a suitable signal being applied to the control circuit; a unidirectional source of power; load means, said load means being connected in circuit with said switching means and said source of power so that the energization of said load means is controlled by the condition of operation of said switching means; and first timing means having its energizing circuit connected in parallel with said load means and being activated simultaneously therewith to commence a timing function for controlling the energized time of said load means, the first portion of said timing means including a condition responsive impedance element for adjusting said timing means, said timing means also including means for producing a signal upon a predetermined timing interval having elapsed after said activation, said signal being applied to said control circuit to cause said electronic switching means to switch to the first operating condition; and second timing means connected to said switching means for causing said switching means to switch to said second conductive condition upon said load means having been de-energized for a predetermined interval.

4. Semiconductor control apparatus for providing a pulse output to a load in response to a condition. the condition effecting modulation of the output pulse width, comprising: bistable semiconductor switching means having an off non-conductive condition of operation and a current conductive on condition comprising a plurality of electrodes including at least an output electrode, an input electrode and a control electrode, said switching means being operable to said current conductive condition upon a signal being applied to said control electrode; unidirectional current producing means having a first and a second terminal; load means, said load means being connected interjacent the first terminal of said current producing means and said output electrode; means connecting the second terminal of said current producing means to said input electrode; first condition responsive timing means connected to said load means and said control electrode and energized when said switching means switches to the on condition to commence a timing function for controlling the on time of said semiconductor switching means, said first timing means including a condition responsive impedance element for adjusting said timing means, said timing means also including means for producing a signal to said control electrode upon a predetermined time having elapsed to cause said semiconductor switching means to switch to the non-conductive condition; and further means connected to said switching means for rendering said switching means conductive.

5. Pulse width modulation semiconductor control apparatus for providing controllable pulse energization to a load in response to a condition comprising: semiconductor switch means having switching terminals and a control circuit, said switch means being operable from one to the other of two stable operating conditions; load means; a source of electrical energy; circuit means including the switching terminals of said semiconductor switching means connecting said load means to said source; first timing means connected to be energized to initiate timing action upon said switching means being in the non-conductive operating condition, said first timing means being connected to provide an output signal pulse to the control circuit of said switching means at the conclusion of said timing action to cause said switching means to become conductive to thereby energize said load means; and second adjustable timing means connected to be energized to initiate timing action upon said switching means being switched to the conductive operating condition, said second timing means including a condition responsive impedance element for controlling the timing adjustment as a function of said condition, said second timing means including an output circuit connected to the control circuit of said semiconductor switch means, said second timing means providing an output signal upon the timing interval having elapsed to cause said semiconductor switch means to switch to the non-conductive condition to de-energize said load means, so that the energization of said load means is controlled as a function of said condition.

6. Pulse width modulation semiconductor control apparatus for providing controllable pulse energization to a load in response to a condition comprising: a source of electrical energy; load means; semiconductor switch means comprising first and second semiconductor amplifying devices, each of said devices having a plurality of electrodes including an output electrode, a control selectrode and a common electrode; conductive means connecting the common electrodes of said first and second semiconductor amplifying devices to a first terminal of said source; circuit means including said load means connecting the output electrode of said second semiconductor device to the other terminal of said source; conductive means connecting the output electrode of each of said semiconductor devices to the control electrode of the other of said devices; said semiconductor switching means having a first non-conductive condition of operation and a second current conductive condition of operation, said switching means being operable from one to the other of said conditions upon a suitable signal being applied to one of said control electrodes; first condition responsive timing means connected to said load means and energized to commence timing when said switching means switches to the second conductive operating condition, said first portion including a condition responsive impedance element for adjusting said timing means, said timing means also including means for producing a signal upon a predetermined timing interval having elapsed to the control electrode of said first semiconductor device to cause said electronic switching means to switch to said first operating condition, and second timing means connected to commence timing upon said switching means being operated to said first condition and adapted to provide a pulse to said switching means control electrode for causing said switching means to switch to said second conductive condition upon said load means having been de-energized for a predetermined timing interval.

7. Semiconductor control apparatus for providing controllable pulse energization to a load in response to a condition comprising: a semiconductor switching means having two conditions of operation consisting of a first non-conductive condition and a second current conductive condition, said semiconductor switching means comprising a plurality of electrodes including switching electrodes and a control electrode, said switching means being operable from one to the other of said conditions upon a suitable signal being applied to said control electrode; a source of electrical energy; load means; circuit means including said semiconductor switching means switching electrodes connecting said load means to said source; signal producing means for periodically rendering said semiconductor switching means conductive; and pulse producing timing means connected to said control electrode comprising capacitor means, normally nonconductive gas tube means and circuit means connected to charge said capacitor when said load means is energized, and further circuit means including said gas tube means connected across said capacitor means for discharging said capacitor means upon a predetermined potential existing thereacross, said discharging current being effective to switch said semiconductor switching means to said first non-conductive condition of operation.

8. Semiconductor apparatus for producing a variable square wave pulse output in response to a condition comprising: a main source of unidirectional potential; load means having first and second terminals; semiconductor switching means comprising a plurality of electrodes including at least a control electrode and a pair of output switching electrodes; conductive means connecting the first terminal of said load means to one terminal of said source; means including the output electrodes of said semiconductor switching means connecting the second terminal of said load means to the other terminal of said source, said switching means having a non-conductive and a conductive state of operation, said switching means being operable from one to the other of said conditions by a suitable signal to thereby control the energization of said load means; signal producing means connected to said control electrode for periodically rendering said switching means conductive; second potential producing means having one terminal thereof connected to the first terminal of said load means; capacitor timing means; condition responsive impedance means; circuit means including said capacitor means and said condition responsive impedance means connecting the second terminal of said second potential producing means to the second terminal of said load means such that when said load means is energized said capacitor means is charged through said condition responsive impedance means to a relatively high value; and normally non-conductive gas tube means connected across said second capacitor means for discharging said capacitor means and providing a signal to switch said semiconductor switching means to the non-conductive condition upon the charge across said capacitor means increasing to a predetermined potential.

9. Semiconductor apparatus for producing variable pulse energization to a load device in response to a condition comprising: a main source of unidirectional potential; load means having first and second terminals; electronic switching means including a semiconductor amplifying device, said switching means comprising a plurality of elements including at least a control element and a pair of output switching elements; conductive means connecting the first terminal of said load means to one terminal of said source; means including the output elements of said electronic switching means connecting the second terminal of said load means to the other terminal of said source, said switching means having a non-conductive and a conductive state of operation, said switching means being operable from one to the other of said conditions by application of a suitable signal to said control element to thereby control the energization of said load means; signal producing timing means connected to said control element for causing said switching means to become conductive after a predetermined interval to thereby energize said load means; said potential producing means having one terminal thereof connected to the first terminal of said load means; capacitor timing means; condition responsive impedance means; circuit means including said capacitor means and said condition responsive impedance means connecting the second terminal of said second potential producing means to the second terminal of said load means such that when said load means is energized said capacitor means is charged through said condition responsive impedance means to a relatively high value; and normally nonconductive gas tube means connected across said second capacitor means for discharging said capacitor means and providing a signal to switch said semiconductor switching means to the non-conductive condition upon the charge across said capacitor means increasing to a predetermined potential.

10. Semiconductor apparatus for producing a variable square wave pulse output in response to a condition comprising: a main source of unidirectional potential; load means having first and second terminals; bistable electronic switching means including a semiconductor amplifying device, said switching means comprising at least a control circuit and an output switching circuit conductive means connecting the first terminal of said load means to one terminal of said source; means including the output circuit of said switching means connecting the second terminal of said load means to the other terminal of said source, said switching means having a nonconductive and a conductive state of operation, said switching means being operable from one to the other of said conditions in response to a suitable signal to thereby control the energization of said load means; first impedance means providing a bias current path for said switching means connected between said control circuit and the second terminal of said load means, said first impedance means having a relatively high resistance compared to the resistance of said load means and having a relatively high potential thereacross when said load means is unenergized; normally non-conductive first electronic gas tube means; first capacitor timing means; means connecting one terminal of said capacitor means to the control circuit of said switching means; second potential producing means, said means being connected interjacent the other terminal of said capacitor means and the second terminal of said load means, said second potential and said impedance means potential being effective to charge said first capacitor means; circuit means comprising said gas tube means connecting the other terminal of said capacitor means to the output circuit of said switching means for discharging said first capacitor means and producing a signal to said control circuit to switch on said switching means; third potential producing means having one terminal thereof connected to the first terminal of said load means; second capacitor timing means; condition responsive impedance means; means including said second capacitor timing means and said condition responsive impedance means connecting the second terminal of said load means; and normally non-conductive gas tube means connected across said second capacitor means for discharging said second capacitor means and producing a signal to said control circuit to switch said switching means upon a predetermined potential existing across said capacitor means.

References Cited in the file of this patent

UNITED STATES PATENTS

| | | |
|---|---|---|
| 2,821,571 | Harris | Jan. 28, 1958 |
| 2,836,734 | Cichanowicz | May 27, 1958 |
| 2,845,548 | Silliman et al. | July 29, 1958 |